United States Patent
Sakai et al.

(10) Patent No.: US 7,225,358 B2
(45) Date of Patent: May 29, 2007

(54) SEMICONDUCTOR INTEGRATED CIRCUIT DEVICE HAVING OPERATION TEST FUNCTION

(75) Inventors: Kenichi Sakai, Hyogo (JP); Yasushi Koseko, Hyogo (JP); Yasumasa Morita, Hyogo (JP)

(73) Assignees: Renesas Technology Corp., Chiyoda-Ku, Tokyo (JP); Mitsubishi Electric Engineering Company Limited, Chiyoda-Ku, Tokyo (JP)

( * ) Notice: Subject to any disclaimer, the term of this patent is extended or adjusted under 35 U.S.C. 154(b) by 587 days.

(21) Appl. No.: 10/354,139

(22) Filed: Jan. 30, 2003

(65) Prior Publication Data

US 2004/0030978 A1   Feb. 12, 2004

(30) Foreign Application Priority Data

Aug. 9, 2002   (JP)   ............................... 2002-232816

(51) Int. Cl.
*G06F 11/00*   (2006.01)
(52) U.S. Cl. ........................................ 714/30; 714/733
(58) Field of Classification Search ................. 714/30, 714/734, 733
See application file for complete search history.

(56) References Cited

U.S. PATENT DOCUMENTS

| | | | | |
|---|---|---|---|---|
| 4,864,579 A | * | 9/1989 | Kishida et al. ............ | 714/726 |
| 4,870,345 A | * | 9/1989 | Tomioka et al. ............ | 714/731 |
| 4,995,039 A | * | 2/1991 | Sakashita et al. .......... | 714/731 |
| 5,592,493 A | * | 1/1997 | Crouch et al. ............. | 714/729 |
| 5,809,039 A | * | 9/1998 | Takahashi et al. .......... | 714/726 |
| 5,809,040 A | * | 9/1998 | Dallmann et al. .......... | 714/736 |
| 6,425,104 B1 | * | 7/2002 | Toumiya ..................... | 714/738 |
| 2002/0069382 A1 | * | 6/2002 | Hayashi et al. ............ | 714/715 |
| 2003/0131327 A1 | * | 7/2003 | Dervisoglu et al. .......... | 716/4 |

FOREIGN PATENT DOCUMENTS

| | | |
|---|---|---|
| JP | 01-307853 | 12/1989 |
| JP | 6-123761 | 5/1994 |
| JP | 2001-203322 | 7/2001 |

OTHER PUBLICATIONS

Japanese Office Action, with English-language translation, dated Nov. 21, 2006.

* cited by examiner

*Primary Examiner*—Dieu-Minh Le
(74) *Attorney, Agent, or Firm*—Buchanan Ingersoll & Rooney PC (57) ABSTRACT

When an operation test is performed to a plurality of circuit blocks each having the same circuit configuration, common test pattern data is transmitted to the respective circuit blocks through corresponding selector circuits.

5 Claims, 6 Drawing Sheets

| EXPECTED VALUE PATTERN | TEST OUTPUT OF CIRCUIT BLOCK | OUTPUT WHEN FAILURE OCCURS | TDOa (AND GATE) | TDOb (OR GATE) | EX-OR GATE EXPECTED VALUE | TDOc |
|---|---|---|---|---|---|---|
| EXD =0 | SCAN OUTPUTS OF ALL CIRCUIT BLOCKS ARE "0" (ALL CIRCUIT BLOCKS NORMALLY OPERATE) | — | 0 | 0 | 0 | 0 |
| EXD =0 | ONE OF SCAN OUTPUTS OF CIRCUIT BLOCKS IS "1" (A PART OF CIRCUIT BLOCKS FAILS) | 1 (OR GATE) | 0 | 1 DETECTION OF FAILURE | 0 | 1 DETECTION OF FAILURE |
| EXD =0 | SCAN OUTPUTS OF ALL CIRCUIT BLOCKS ARE "1" (ALL CIRCUIT BLOCKS FAIL) | 1 (OR GATE) | 1 DETECTION OF FAILURE | 1 DETECTION OF FAILURE | 0 | 0 |
| EXD =1 | SCAN OUTPUTS OF ALL CIRCUIT BLOCKS ARE "1" (ALL CIRCUIT BLOCK NORMALLY OPERATE) | — | 1 | 1 | 0 | 0 |
| EXD =1 | ONE OF SCAN OUTPUTS OF CIRCUIT BLOCKS IS "0" (A PART OF CIRCUIT BLOCKS FAILS) | 0 (AND GATE) | 0 DETECTION OF FAILURE | 1 | 0 | 1 DETECTION OF FAILURE |
| EXD =1 | SCAN OUTPUTS OF ALL CIRCUIT BLOCKS ARE "0" (ALL CIRCUIT BLOCKS FAIL) | 0 (AND GATE) | 0 DETECTION OF FAILURE | 0 DETECTION OF FAILURE | 0 | 0 |

FIG.6 PRIOR ART

SEMICONDUCTOR INTEGRATED CIRCUIT DEVICE HAVING OPERATION TEST FUNCTION

BACKGROUND OF THE INVENTION

1. Field of the Invention

The present invention relates to a semiconductor integrated circuit device, and more particularly to an operation test performed in a semiconductor integrated circuit device including a plurality of circuit blocks having the same function.

2. Description of the Background Art

Following the recent development of the circuit integration technique, the development of semiconductor integrated circuit devices, represented by LSI (Large Scale Integrated Circuit), including a plurality of circuit blocks is underway. Before shipping these semiconductor integrated circuit devices, it is necessary to select non-defective and defective devices by performing operation tests. However, as the semiconductor integrated circuit devices are made larger in size, demand for efficiently executing such operation tests at low cost rises. Specifically, it is demanded to prevent the cost hike of an LSI tester used to executed each operation test and to reduce operation test time.

Figure 6:
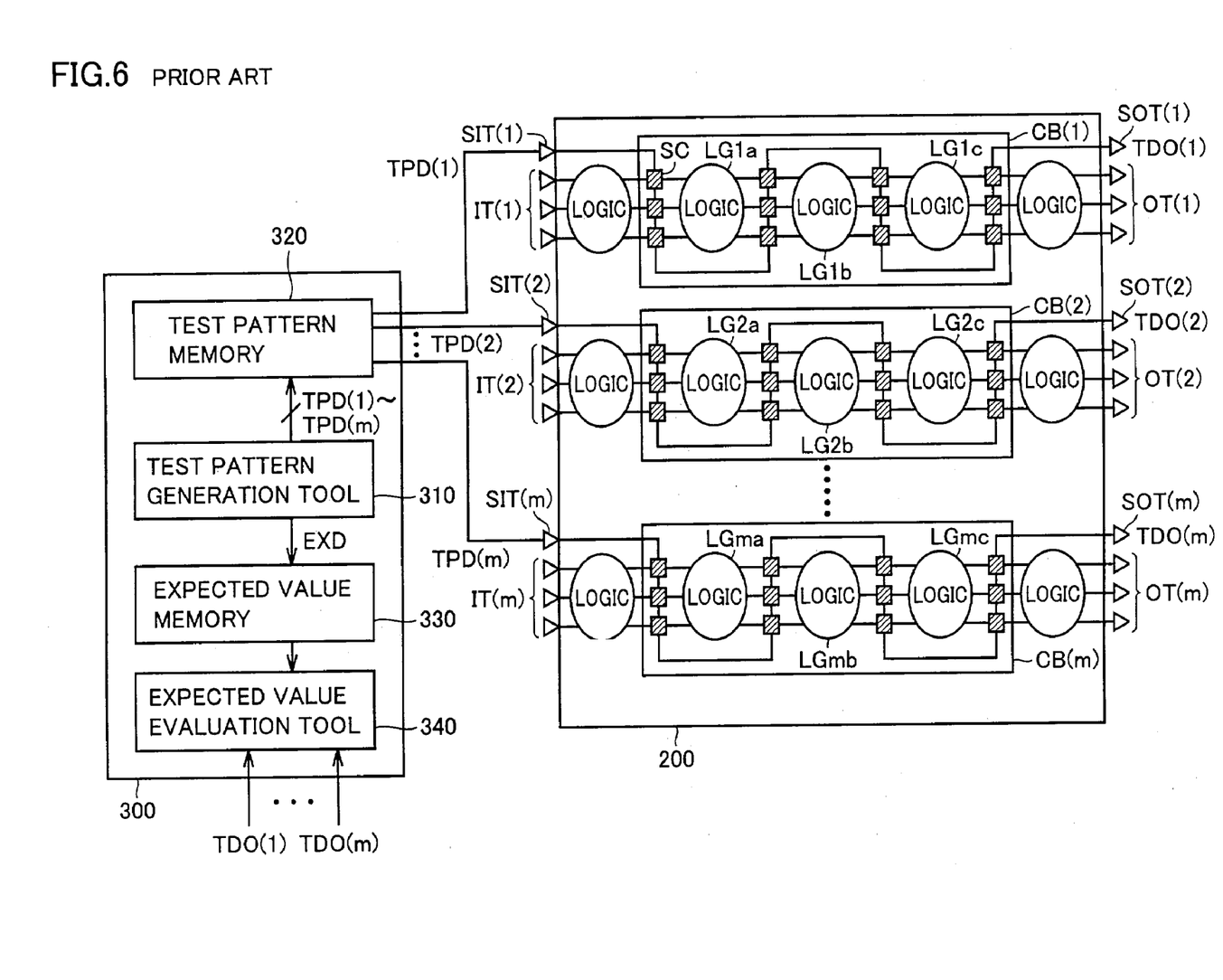
FIG. 6 is a block diagram for describing the configuration of an operation test to a conventional semiconductor integrated circuit device.

FIG. 6 is a block diagram for describing the configuration of an operation test performed to a conventional semiconductor integrated circuit device.

Referring to FIG. 6, a conventional semiconductor integrated circuit device 200 includes a plurality of circuit blocks CB(1), CB(2), . . . , and CB(m). Each of circuit blocks CB(1), CB(2), . . . , and CB(m) consists of a plurality of logic circuits (m is natural number). For example, circuit block CB(1) consists of logic circuits LG1a, LG1b and LG1c. Circuit block CB(2) consists of logic circuits LG2a, LG2b and LG2c. Circuit block CB(m) consists of logic circuits LGma, LGmb and LGmc. These logic circuits will be also, typically referred to as "logic circuit LG" hereinafter.

Data input terminals IT(1) to IT(m) and data output terminals OT(1) to OT(m) are provided to correspond to circuit blocks CB(1) to CB(m), respectively. In normal operation, pieces of input data inputted into data input terminals IT(1) to IT(m) are sequentially subjected to predetermined logic operations by corresponding logic circuits LG, and pieces of obtained output data are outputted from corresponding data output terminals OT(1) to OT(m), respectively.

Each of logic circuits LG operates in response to a system clock which is not shown. The system clock is supplied from the outside of semiconductor integrated circuit device 200 in the normal operation. Alternatively, the system clock can be automatically generated in semiconductor integrated circuit device 200. In an operation test, the system clock is applied from an LSI tester 300, which tests the operation of semiconductor integrated circuit 200, to respective logic circuits LG.

Further, in order to execute operation tests to these circuit blocks, scan input terminals SIT(1) to SIT(m) and scan output terminals SOT(1) to SOT(m) are arranged to correspond to circuit blocks CB(1) to CB(m), respectively.

In the operation test, test pattern data TPD(1) to TPD(m) used in the operation tests to circuit blocks CB(1) to CB(m) are inputted into scan input terminals SIT(1) to SIT(m), respectively.

Test pattern data TPD(1) to TPD(m) are generated by LSI tester 300. LSI tester 300 includes a test pattern generation tool 310, a test pattern memory 320, an expected value memory 330, and an expected value evaluation tool 340.

Test pattern generation tool 310 automatically generates test pattern data TPD(1) to TPD(m) used for executing operation tests in circuit blocks CB(1) to CB(m), respectively, on the basis of preset test patterns. Test pattern data TPD(1) to TPD(m) generated by test pattern generation tool 310 are temporarily stored in test pattern memory 320, and inputted into circuit blocks CB(1) to CB(m) through scan input terminals SIT(1) to SIT(m), respectively.

Test pattern generation tool 310 also generates a group of expected value data EXD corresponding to test pattern data TPD(1) to TPD(m), respectively. Expected value data group EXD is transmitted to and stored in expected value memory 330. Expected value data group EXD stored in expected value memory 330 is transmitted to expected value evaluation tool 340 if necessary.

An operation test executed in each circuit block will next be described, taking an operation test in circuit block CB(1) as an example.

Test pattern data TPD(1) inputted into scan input terminal SIT(1) is transmitted to a leading scan cell SC. In an operation test, a scan clock (not shown) is inputted into respective scan cells SC from LSI tester 300. Scan cell SC consecutively shifts the test pattern data applied thereto, to next scan cell SC in response to the scan clock. For example, leading scan cell SC captures data inputted into scan input terminal SIT(1) and transmits the data which has been held therein so far to next scan cell SC in response to the scan clock. The supply of the scan clock from LSI tester 300 is continuously executed until test pattern data TPD(1) is transmitted to all corresponding scan cells SC in accordance with a predetermined test pattern.

When the setting of the test pattern data to scan cells SC is completed, the system clock is supplied to respective logic circuits LG from LSI tester 300. In response to the supply of the system clock, each logic circuit LG executes a predetermined logic operation and executes an operation processing based on the data inputted into corresponding scan cells SC. At a timing at which the operation test target logic circuits complete their operation processings, LSI tester 300 stops supplying the system clock thereto. At this stage, output data which is an operation processing result corresponding to test pattern data TPD(1) in each logic circuit LG has been outputted to corresponding scan cells SC.

LSI tester 300 restarts supplying the scan clock to respective scan cells SC so as to output the output data from scan output terminal SOUT(1). In response to the restart of the supply of the scan clock, pieces of output data from logic circuits LG1a, LG1b and LG1c which constitutes circuit block CB(1), are sequentially outputted from scan output terminal SOUT(1) as pieces of test output data TDO(1).

As can be seen, the pieces of test output data TDO(1) which have been sequentially outputted are transmitted to expected value evaluation tool 340 in LSI tester 300. Expected value evaluation tool 340 compares the expected value among expected value data group EXD stored in expected value memory 330 in advance, corresponding to the pieces of test output data TDO(1), with the pieces of test output data TDO(1), respectively, and thereby evaluates whether the operation of circuit block CB(1) is normal, i.e., whether there is a failure in circuit block CB(1).

The same operation test as that performed to circuit block CB(1) can be executed to each of other circuit blocks CB(2) to CB(m). Therefore, it is possible to execute operation tests in respective circuit blocks CB(1) to CB(m) in parallel and to complete the operation tests to the plurality of circuit blocks in short time.

Recently, a plurality of circuit blocks each having the same circuit configuration and the same function are mounted on the same semiconductor integrated circuit device quite frequently. This corresponds to a case, for example, in which each of circuit blocks CB(1) to CB(m) shown in FIG. 6 has the same function and the same circuit configuration.

However, with the configuration of the conventional semiconductor integrated circuit device shown in FIG. 6, pieces of test pattern data TPD(1) to TPD(m) are inputted into the respective circuit blocks independently of one another. Due to this, operation tests can be advantageously executed to a plurality of circuit blocks in parallel even if they differ in function. On the other hand, if each of the circuit blocks has the same circuit configuration, operation tests becomes disadvantageously inefficient.

That is, even if each of circuit blocks CB(1) to CB(m) has the same circuit configuration and an operation test can be executed in response to the input of common test pattern data, it is required to separately generate test pattern data TPD(1) to TPD(m) to correspond to the m circuit blocks, respectively. As a result, test pattern memory 320 and expected value memory 330 included in LSI tester 300 become disadvantageously large in size.

Consequently, in order to perform an operation test to a semiconductor integrated circuit device which includes a plurality of circuit blocks each having the same function, it is necessary to employ a relatively expensive LSI tester which includes a mass storage test pattern memory and a mass storage expected value memory. In addition, the operation time of test pattern generation tool 310 which generates the test pattern data and the expected value group is lengthened, thereby disadvantageously deteriorating the efficiency of the operation test.

SUMMARY OF THE INVENTION

It is an object of the present invention to improve the efficiency of an operation test performed to a semiconductor integrated circuit device which includes a plurality of circuit blocks each having the same circuit configuration and the same function.

A semiconductor integrated circuit device according to the present invention includes: a plurality of circuit blocks each having the same function; a data input terminal receiving test pattern data used for an operation test; a select circuit for transmitting the test pattern data inputted into the data input terminal to each of the plurality of circuit blocks during the operation test; and a plurality of first test output terminals, provided to correspond to the plurality of circuit blocks, respectively, each for outputting output data outputted from corresponding one of the circuit blocks in response to the test pattern data during the operation test.

Therefore, a main advantage of the present invention is in that test pattern data and expected value data of test results in response to the test pattern data can be shared among a plurality of circuit blocks each having the same function and the same circuit configuration in a semiconductor integrated circuit device. Accordingly, it is possible to reduce generation time and the capacities of memory regions for the test pattern data and the expected value data, in a LSI tester which generates the test pattern data and the expected value data. As a result, it is possible to realize the cost reduction of the LSI tester and the reduction of generation time, and it is thereby possible to improve the efficiency of an operation test performed to a semiconductor integrated circuit device which includes a plurality of circuit blocks each having the same circuit configuration and the same function.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings. It is noted that the same reference symbols denote the same or corresponding constituent elements, respectively in the drawings.

First Embodiment

Figure 1:
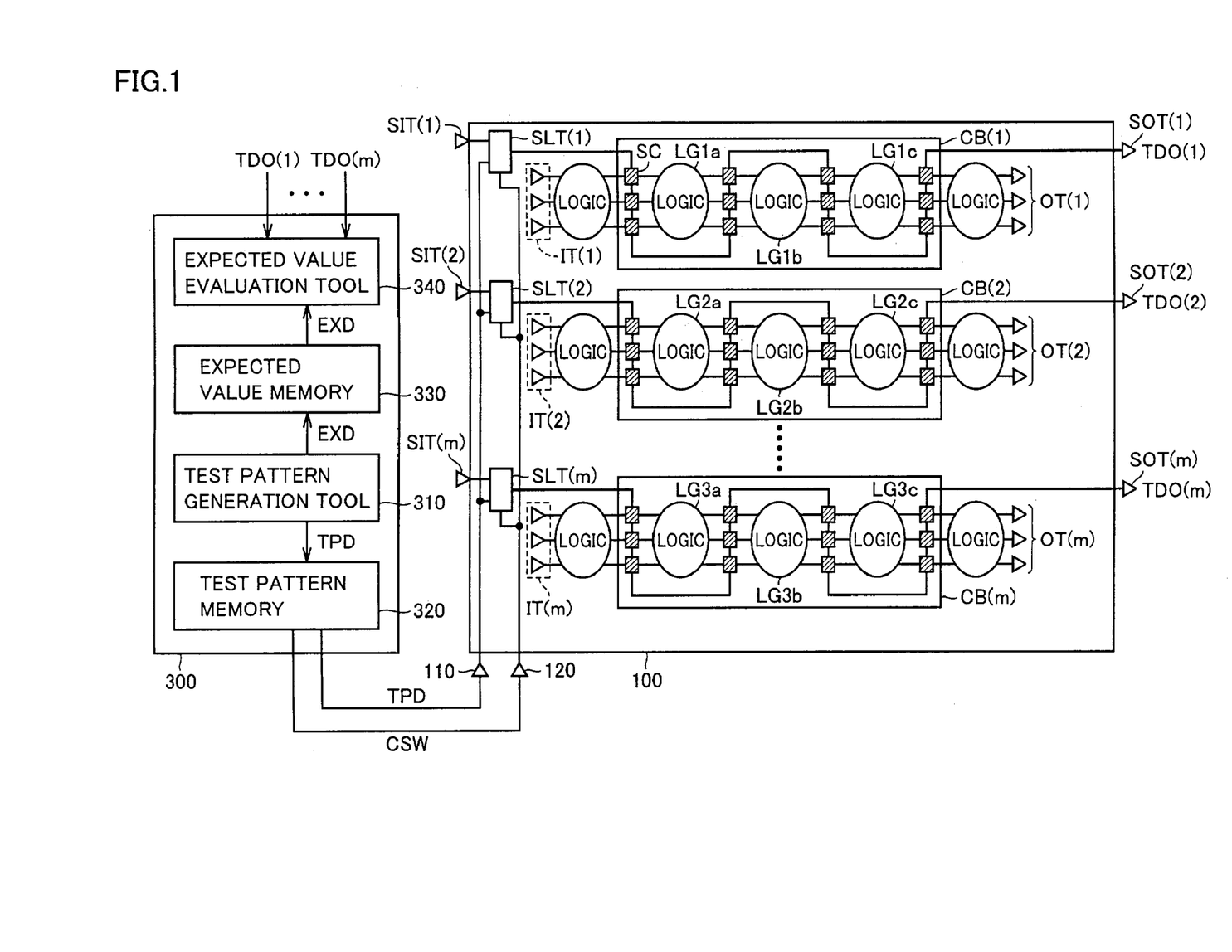
FIG. 1 is a block diagram showing the configuration of a semiconductor integrated circuit device according to a first embodiment of the present invention.

Referring to FIG. 1, a semiconductor integrated circuit device 100 according to a first embodiment differs from conventional semiconductor integrated circuit device 200 shown in FIG. 6 in that a common data input terminal 110, a common signal input terminal 120 and selector circuits SLT(1) to SLT(m) are further provided. Since the other constituent elements of semiconductor integrated circuit device 100 are the same as those of conventional semiconductor integrated circuit device 200 shown in FIG. 6, they will not be repeatedly described herein in detail.

Selectors SLT(1) to SLT(m) are provided to correspond to circuit blocks CB(1) to CB(m), respectively, and operate in response to a switch control signal CSW inputted into common signal input terminal 120. Test pattern data TPD used in circuit blocks CB(1) to CB(m) in common is inputted into common data input terminal 110.

Selector circuits SLT(1) to SLT(m) transmit either test pattern data inputted into corresponding scan input terminals SIT(1) to SIT(m) or test pattern data TPD inputted into common data input terminal 110, to corresponding circuit blocks in response to switch control signal CSW, respectively. For example, when switch control signal CSW is at high level, selector circuit SLT(1) transmits test pattern data TPD inputted into common data input terminal 110 to circuit block CB(1). When switch control signal CSW is at low level, selector circuit SLT(1) transmits the test pattern data inputted into scan input terminal SIT(1) to circuit block CB(1). Similarly, selector circuits SLT(2) to SLT(m) operate in response to common switch control signal CSW.

Pieces of the test pattern data transmitted by selector circuits SLT(1) to SLT(m) to circuit blocks CB(1) to CB(m) are applied to scan cells SC operating in response to a scan clock (not shown), as input data of predetermined logic circuits LG, respectively, as in the case of semiconductor integrated circuit device 200 shown in FIG. 6.

If each of test target circuit blocks CB(1) to CB(m) has the same circuit configuration and the same function, switch control signal CSW is set at high level and test pattern data TPD inputted into common data input terminal 110 is supplied to each of circuit blocks CB(1) to CB(m).

As already described, if the test pattern data reaches a predetermined scan cell on the basis of a predetermined test pattern, a system clock (not shown), is supplied from an LSI tester 300 to logic circuits LG and respective logic circuits LG execute predetermined logic operation processings.

Thereafter, in accordance with the same procedures as those described with reference to FIG. 6, pieces of the output data of respective logic circuits LG are sequentially outputted from scan output terminals SOT(1) to SOT(m) as test output data TDO(1) to TDO(m) which indicate operation test results, in response to the scan clock.

It is possible to constitute the system clock and the scan clock by a common clock. In this case, each scan cell SC and each logic circuit LG operate in response to the common clock. With this configuration, however, it is necessary to prohibit an operation for transmitting the data from one scan cell SC to next scan cell SC at a timing at which output data is outputted from each logic circuit LG to each scan cell SC.

Test output data TDO(1) to TDO(m) obtained in circuit blocks CB(1) to CB(m) are transmitted to expected value evaluation tool 340 of LSI tester 300, compared with expected value data group EXD stored in an expected value memory 330 in advance so as to evaluate the operation test results of semiconductor integrated circuit device 100. By applying common test pattern data to a plurality of circuit blocks each having the same function and the same circuit configuration, the expected values of the test output data from the respective circuit blocks become equal.

As described above, according to the operation test performed to the semiconductor integrated circuit device according to the first embodiment, it is possible to share test pattern data TPD and expected value data group EXD among a plurality of circuit blocks each of which has the same function and the same circuit configuration. Therefore, it is possible to reduce the data generation time of test pattern generation tool 310 and to reduce the storage capacities of test pattern memory 320 and expected value memory 330 in LSI tester 300. As a result, it is possible to realize the reduction of the cost of the LSI tester and the reduction of the operation test time of the LSI tester, and to thereby improve the efficiency of the operation test performed to the semiconductor integrated circuit device which includes a plurality of circuit blocks each having the same circuit configuration and the same function.

Since scan input terminals SIT(1) to SIT(m) and scan output terminals SOT(1) to SOT(m) are provided to correspond to circuit blocks CB(1) to CB(m), respectively, as in the case of conventional semiconductor integrated circuit device 200 shown in FIG. 6, it is possible to execute an operation test only to a part of the circuit blocks if necessary.

Second Embodiment

As already described above, in the operation test according to the present invention, the expected values of the test output data from a plurality of circuit blocks each having the same circuit configuration and the same function are equal among the respective circuit blocks. In a second embodiment, therefore, a configuration, which makes it possible to execute the evaluation of test output data more efficiently by utilizing the above-described feature, will be described.

Figure 2:
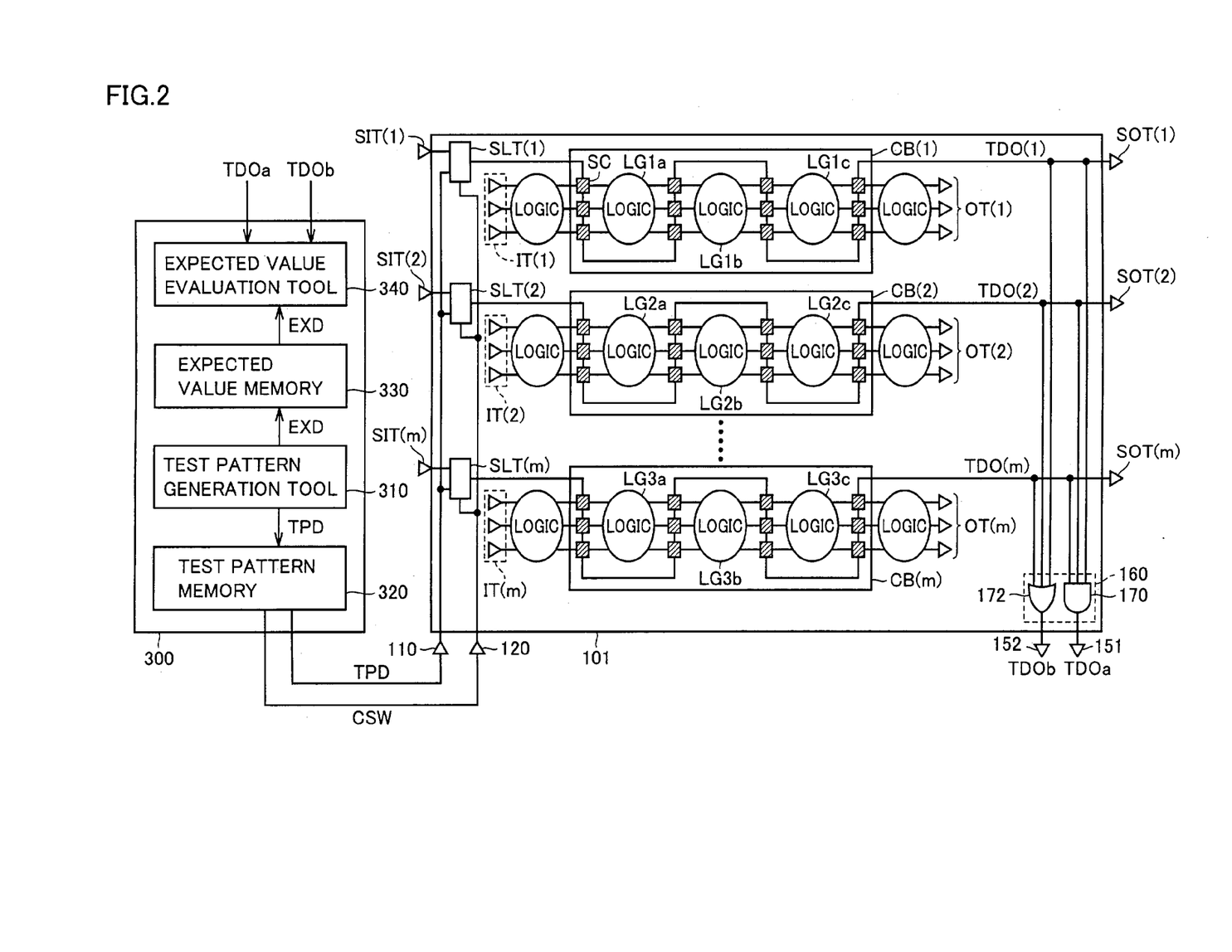
FIG. 2 is a block diagram showing the configuration of a semiconductor integrated circuit device according to a second embodiment.

Referring to FIG. 2, a semiconductor integrated circuit device 101 according to a second embodiment differs from semiconductor integrated circuit device 100 according to the first embodiment in that test output terminals 151 and 152, and a logic operation section 160 are further provided. Since the other constituent elements of semiconductor integrated circuit 101 are the same as those of semiconductor integrated circuit 100 according to the first embodiment, they will not be repeatedly described herein in detail.

Logic operation section 160 includes a logic gate 170 which outputs the result of an AND operation performed with respect to test output data TDO(1) to TDO(m) outputted from circuit blocks CB(1) to CB(m), respectively, and a logic gate 172 which outputs the result of an OR operation performed with respect to test output data TDO(1) to TDO(m).

The outputs of logic gates 170 and 172 are outputted from test output terminals 151 and 152 as test output data TDOa and TDOb, respectively. Test output data TDOa and TDOb thus outputted are transmitted to expected value evaluation tool 340 of LSI tester 300.

As for semiconductor integrated circuit device 101, if the expected values of respective test output data TDO(1) to TDO(m) are "1", it is possible to detect whether or not there is a failure in semiconductor integrated circuit device 101 based on test output data TDOa outputted from logic gate 170. That is, if all circuit blocks CB(1) to CB(m) normally operate and the expected values of respective test output data TDO(1) to TDO(m) are "1", test output data TDOa is "1". If at least one of the circuit blocks fails, test output data TDOa is "0".

Conversely, if the expected values of respective test output data TDO(1) to TDO(m) are "0", it is possible to detect whether or not there is a failure in semiconductor integrated circuit device 101 based on test output data TDOb outputted from logic gate 172. That is, if all circuit blocks CB(1) to CB(m) normally operate and the expected values of respective test data TDO(1) to TDO(m) are "0", test output data TDOb is "0". If at least one of the circuit blocks fails, test output data TDOb is "1".

By adopting the above-described configuration, expected value data group EXD may be generated to correspond not to circuit blocks CB(1) to CB(m), respectively, but to correspond to test output data TDOa and TDOb. Therefore, it is possible to reduce the operation time of test pattern generation tool 310, reduce the capacity of expected value memory 330, and decrease the circuit scale of expected value evaluation tool 340, and it is thereby possible to further reduce the cost of the LSI tester and further improve the efficiency of the operation test.

If it is discovered that there is a failure in at least a part of the circuit blocks on the basis of test output data TDOa and TDOb, it is possible to specify the circuit block(s) to which the failure generates by test output data TDO(1) to TDO(m) from scan output terminals SOT(1) to SOT(m) provided to correspond to the respective circuit blocks.

First Modification of Second Embodiment

Figure 3:
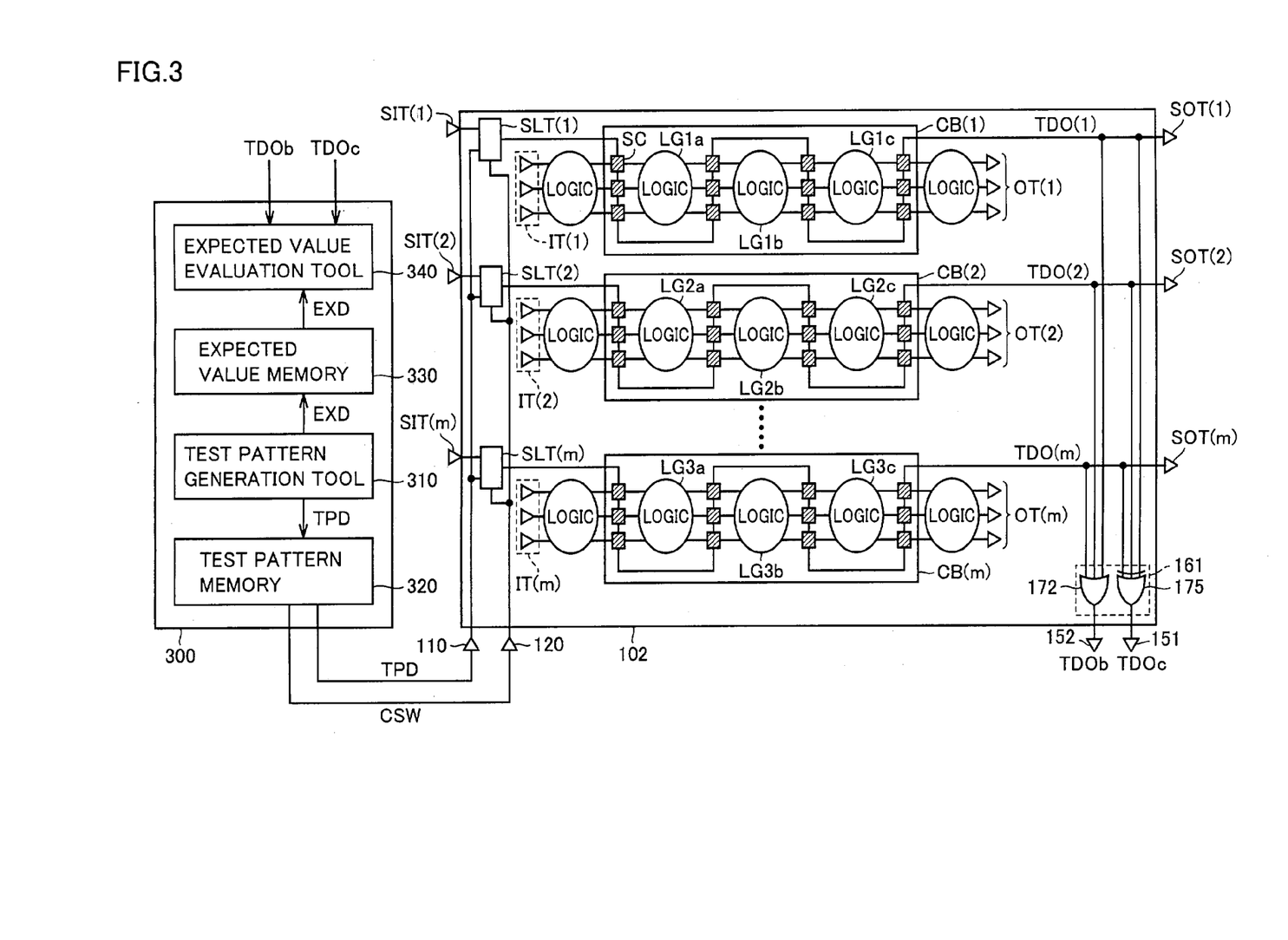
FIG. 3 is a block diagram showing the configuration of a semiconductor integrated circuit device according to a first modification of the second embodiment.

Referring to FIG. 3, a semiconductor integrated circuit device 102 according to a first modification of the second embodiment differs from semiconductor integrated circuit device 101 according to the second embodiment shown in FIG. 2 in that a logic operation section 161 is provided in place of logic operation section 160. Since the other constituent elements of semiconductor integrated circuit device 102 are the same as those of semiconductor integrated circuit device 101 according to the second embodiment, they will not be repeatedly described herein in detail.

Logic operation section 161 includes logic gates 172 and 175. Logic gate 172, similarly to that shown in FIG. 2, outputs the result of an OR operation performed with respect to test output data TDO(1) to TDO(m) as test output data TDOb. Logic gate 175 acts as an identity gate and outputs the result of an exclusive OR (EX-OR) operation performed with respect to test output data TDO(1) to TDO(m) as test output data TDOc. Test output data TDOb is outputted from test output terminal 152. Test output data TDOc is outputted from test output terminal 151.

Accordingly, if all of circuit blocks CB(1) to CB(m) normally operate or all of them fail, test output data TDOc is "0". In addition, it is possible to determine whether all of the circuit blocks normally operate or all of them fail based on test output data TDOb. That is, if test output data TDOc is "0" and test output data TDOb coincides with expected value data, it is determined that all the circuit blocks normally operate.

On the other hand, if test output data TDOc is "1", it is detected that a part of circuit blocks CB(1) to CB(m) fail. In addition, if test output data TDOc is "0" but test output data TDOb does not coincide with the expected value data, it is determined that all the circuit blocks fail.

By adopting the above-described configuration, it is possible to reduce the operation time of test pattern generation tool 310, decrease the capacity of expected value memory 330, and reduce the circuit scale of expected value evaluation tool 340, and to thereby further reduce the cost of the LSI test and further improve the efficiency of the operation test, similarly to semiconductor integrated circuit device 101 according to the second embodiment.

Second Modification of Second Embodiment

Figure 4:
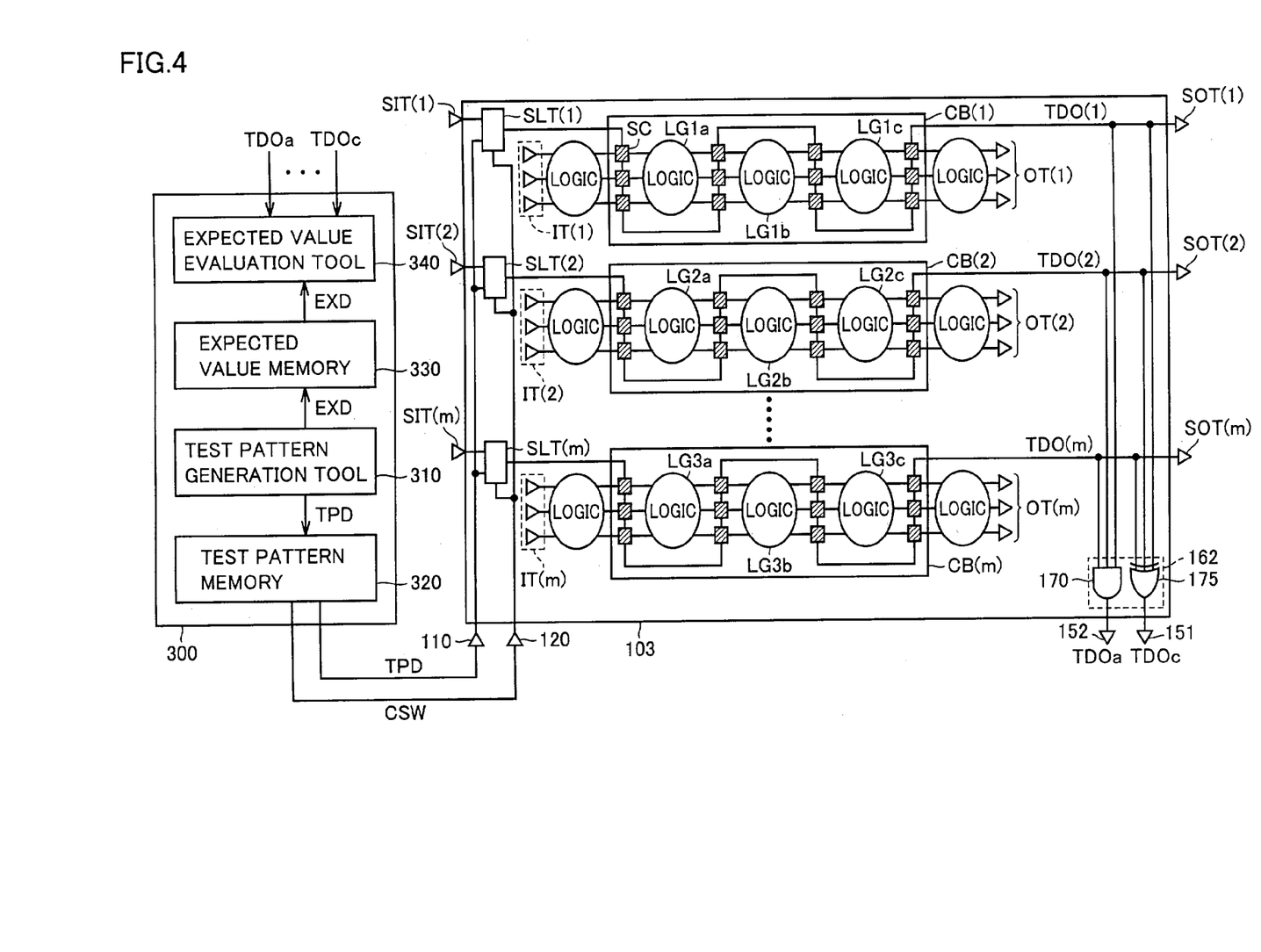
FIG. 4 is a block diagram showing the configuration of a semiconductor integrated circuit device according to a second modification of the second embodiment.

Referring to FIG. 4, a semiconductor integrated circuit device 103 according to a second modification of the second embodiment differs from semiconductor integrated circuit device 101 according to the second embodiment shown in FIG. 2 in that a logic operation section 162 is provided in place of logic operation section 160. Since the other constituent elements of semiconductor integrated circuit device 103 are the same as those of semiconductor integrated circuit device 101 according to the second embodiment, they will not be repeatedly described herein in detail.

Logic operation section 162 includes logic gates 170 and 175. Logic gate 170, similarly to that shown in FIG. 2, outputs the result of an AND operation performed with respect to test output data TDO(1) to TDO(m) as test output data TDOa. Logic gate 175, similarly to that shown in FIG. 3, acts as an identity gate, and outputs test output data TDOc. Test output data TDOa is outputted from test output terminal 152. Test output data TDOc is outputted from test output terminal 151.

By adopting this configuration, it is possible to perform a test to determine whether or not there is a failure in circuit blocks CB(1) to CB(m) based on the level of test output data TDOc and based on the determination as to whether test output data TDOa coincides with expected value data, similarly to semiconductor integrated circuit device 102 shown in FIG. 3. Similarly to semiconductor integrated circuit device 101 described in the second embodiment, it is possible to reduce the operation time of test pattern generation tool 310, decrease the capacity of expected value memory 330, and reduce the circuit scale of expected value evaluation tool 340, and to thereby further reduce the cost of LSI tester 300 and improve the efficiency of the operation test.

Figure 5:
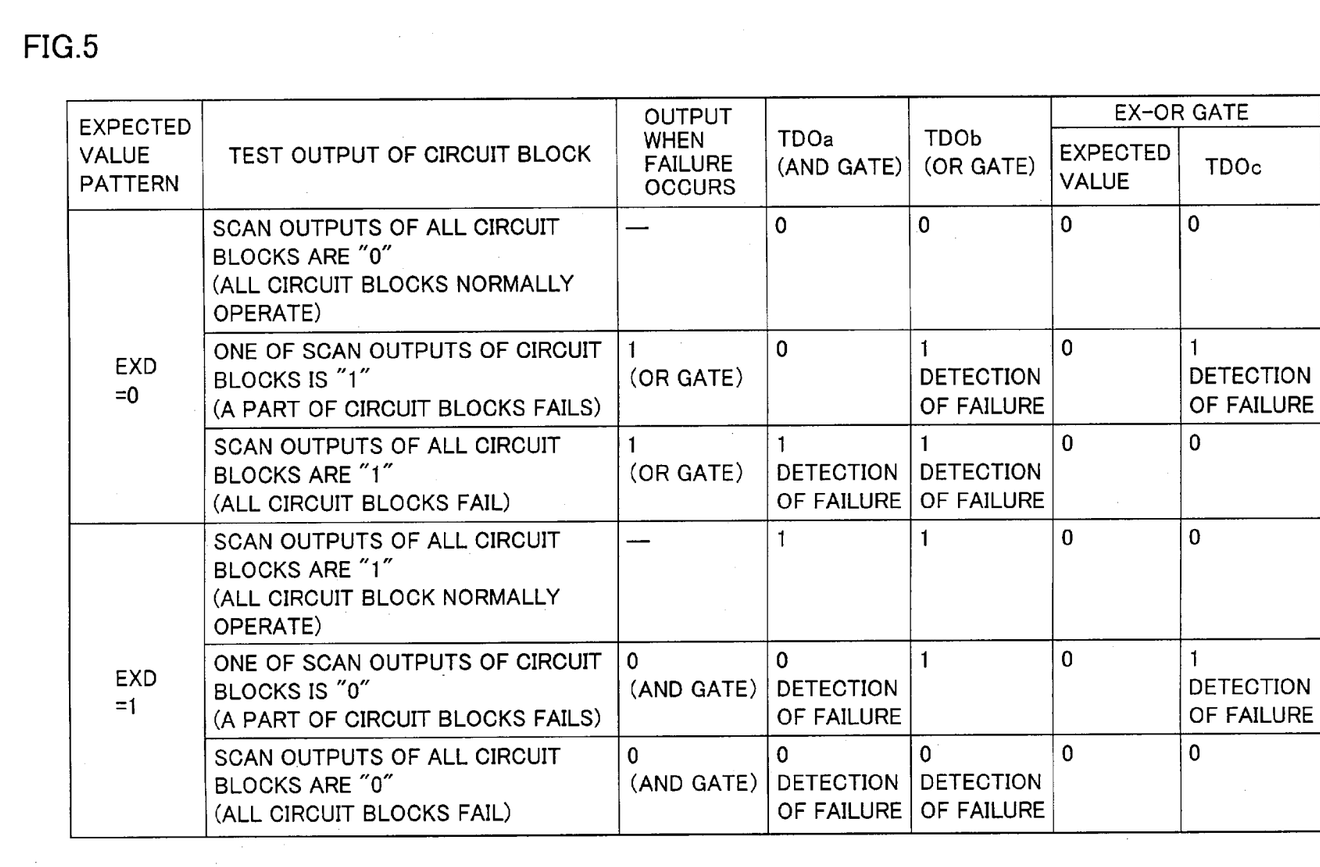
FIG. 5 is a table showing the evaluations of test output data from logic operation sections of the semiconductor integrated circuit devices according to the second embodiment and the modifications of the second embodiment in order.

FIG. 5 is a table showing the evaluations of the test output data outputted from the logic operation sections in the semiconductor integrated circuit devices according to the second embodiment and the modifications of the second embodiment in order.

Referring to FIG. 5, if the expected value of test output data is "0" (EXD=0) and all the circuit blocks normally operate, the output of the OR gate (logic gate 172) is "0". If the expected value of the test output data is "0" (EXD=0) and at least one of the circuit blocks fails, the output of the OR gate (logic gate 172) is "1". Likewise, if the expected value of the test output data is "1" (EXD=1) and all the circuit blocks normally operate, the output of the AND gate (logic gate 170) is "1". If the expected value of the test output data is "1" (EXD=1) and at least one of the circuit blocks fails, the output of the AND gate (logic gate 170) is "0".

Accordingly, as shown in semiconductor integrated circuit device 101 according to the second embodiment, it is possible to detect whether all the circuit blocks normally operate, i.e., whether or not there is a circuit block to which a failure occurs, by the combination of the AND gate and the OR gate.

Furthermore, if all the circuit blocks normally operate, the output of the EX-OR gate (logic gate 175) is "0". That is, the expected value of the output of the EX-OR gate is "0". Accordingly, if the output of the EX-OR gate is "1", it is detected that a part of the circuit blocks fail. Besides, as shown in the semiconductor integrated circuit devices according to the first and second modifications of the second embodiment, it is possible to determine whether all the circuit blocks normally operate or all of them fail by the combination of the EX-OR gate and either the OR gate or the AND gate.

In this way, FIG. 5 also demonstrates that it is possible to efficiently perform a test to determine whether there is a failure in a plurality of circuit blocks by the combinations of the results of the AND operation, the OR operation, and the identity operation performed with respect to the test output data outputted from the plurality of circuit blocks each having the same circuit configuration, to which operation tests are performed in parallel, as shown in semiconductor integrated circuit devices 101, 102 and 103 according to the second embodiment and the first and second modifications of the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a plurality of circuit blocks each including a scan cell and having the same function;
   a plurality of data input terminals provided to correspond to said plurality of circuit blocks;

a common input terminal receiving common test pattern data used for an operation test of said plurality of circuit blocks;

a plurality of select circuits, provided to correspond to said plurality of circuit blocks, each for transmitting either test pattern data input into corresponding one of said plurality of data input terminals or said common test pattern data input into said common input terminal, to each of said plurality of circuit blocks during said operation test in response to a control signal; and a plurality of first test output terminals, provided to correspond to said plurality of circuit blocks, respectively, each for outputting output data output from corresponding one of said circuit blocks in response to said test pattern data or said common test pattern data during said operation test.

2. The semiconductor integrated circuit device according to claim 1, further comprising:

a logic operation section outputting a predetermined logic operation result by inputting said output data from said plurality of circuit blocks, respectively; and a second test output terminal for outputting the result of said logic operation of said logic operation section.

3. The semiconductor integrated circuit device according to claim 2, wherein said logic operation section includes:

a first logic gate outputting a result of an AND operation performed with respect to said output data from said plurality of circuit blocks; and a second logic gate outputting a result of an OR operation performed with respect to said output data from said plurality of circuit blocks.

4. The semiconductor integrated circuit device according to claim 2, wherein said logic operation section includes:

a first logic gate outputting a result of an identity operation performed with respect to said output data from said plurality of circuit blocks, respectively; and a second logic gate outputting a result of an OR operation or a result of an AND operation performed with respect to said output data from said plurality of circuit blocks, respectively.

5. The semiconductor integrated circuit device according to claim 1, wherein each of said plurality of circuit blocks has the same circuit configuration.

* * * * *